(12) United States Patent
Bruneel et al.

(10) Patent No.: US 6,835,644 B2
(45) Date of Patent: Dec. 28, 2004

(54) METHOD FOR MAKING INTERCONNECT STRUCTURES

(75) Inventors: Pierre Stefaan Bruneel, Ghent (BE); Eddy De Backer, Merelbeke (BE); Malik Mastgutovich Fatkhoutdinov, Oudenaarde (BE)

(73) Assignee: AMI Semiconductor Belgium, Oudenaarde (BE)

( * ) Notice: Subject to any disclaimer, the term of this patent is extended or adjusted under 35 U.S.C. 154(b) by 17 days.

(21) Appl. No.: 10/319,348

(22) Filed: Dec. 16, 2002

(65) Prior Publication Data

US 2003/0148602 A1 Aug. 7, 2003

(30) Foreign Application Priority Data

Dec. 17, 2001 (EP) .............................. 01403275

(51) Int. Cl.$^7$ .................. H01L 21/4763; H01L 21/461
(52) U.S. Cl. .................. 438/618; 438/725; 438/669; 438/688
(58) Field of Search .................. 438/669, 688, 438/720, 725, 618, 745, 750, 753, 754, 757, 692, 693

(56) References Cited

U.S. PATENT DOCUMENTS

| | | | | |
|---|---|---|---|---|
| 4,501,061 A | * | 2/1985 | Wonnacott | 438/694 |
| 6,077,762 A | * | 6/2000 | Liang et al. | 438/593 |
| 6,093,658 A | * | 7/2000 | Bothra et al. | 438/745 |
| 6,140,243 A | * | 10/2000 | Wallace et al. | 438/700 |
| 6,153,531 A | * | 11/2000 | Bothra et al. | 438/745 |
| 6,562,416 B2 | * | 5/2003 | Ngo et al. | 427/534 |
| 6,583,046 B1 | * | 6/2003 | Okada et al. | 438/622 |
| 6,613,681 B1 | * | 9/2003 | Hillyer et al. | 438/704 |

* cited by examiner

Primary Examiner—Michael Lebentritt
(74) Attorney, Agent, or Firm—Barnes & Thornburg LLP

(57) ABSTRACT

A method for making interconnect structures, particularly in a semiconductor integrated circuit, is described. The method comprises the steps of:

forming a conductive layer;

forming of an insulating layer above said conductive layer;

creating a plurality of holes in said insulating layer and filling the holes with tungsten thereby forming tungsten plugs, such that said tungsten plugs are in electrical contact with the conductive layer.

A patterned metallisation layer that overlies said insulating layer (is formed by means of following steps:

forming a continuous metallisation layer, forming an organic mask, etching in plasma said continuous metallisation layer, removing the organic mask in a dry way, and immersing the obtained wafer including the layers (3, 4, 5) and the tungsten plugs in a cleaning solution to remove the post-etching residues.

Before immersing into said cleaning solution, the wafer is submitted to a plasma treatment containing F, H or a mixture of F and H. This plasma treatment may be combined with said dry removal of the organic mask, with the purpose of eliminating tungsten plug erosion.

5 Claims, 3 Drawing Sheets

METHOD FOR MAKING INTERCONNECT STRUCTURES

BACKGROUND OF THE INVENTION

1. Field of the Invention

This invention relates to a method for making interconnect structures, particularly in a semiconductor integrated circuit.

2. Background Art

A Method for making interconnect structures comprises forming a conductive layer;

forming of an insulating layer above said conductive layer;

creating a plurality of holes in said insulating layer and filling the holes with tungsten thereby forming tungsten plugs, such that said tungsten plugs are in electrical contact with said conductive layer;

forming a patterned metallisation layer that overlies said insulating layer and said tungsten plugs by means of following steps:
  forming a continuous metallisation layer,
  forming an organic mask,
  etching in plasma said continuous metallisation layer,
  removing the organic mask in a dry way, and
  immersing the obtained wafer including the layers and the tungsten plugs in a cleaning solution to remove any post-etching residues.

Methods of this kind are generally used for fabricating reliable interconnect structures in semiconductor integrated circuits.

The insulating layer, mostly silicon dioxide, is conventionally deposited over the conductive structures.

Within this insulating layer holes are created and subsequently filled with tungsten such as to contact this first conductive layer.

The metallisation layer overlying the insulating layer and the tungsten plugs is usually patterned using the conventional photolithography and plasma etching techniques.

Photolithography is typically accomplished by depositing a photoresist layer, selectively exposing the photoresist layer to light through a patterned reticle, developing the photoresist layer, including wet removal of the non exposed photoresist and the developing products, to form a photoresist mask. This is followed by plasma etching of the exposed metal, removal of the photoresist mask and by removing in a cleaning solution of residues produced during the plasma etching step.

It may happen that the metallisation layer as well as the conductive layer are not electrically connected to the substrate. Consequently, these layers and the tungsten plugs will be electrically charged during the plasma etching. During the immersion of the wafer in the cleaning solution, exposure of the tungsten plugs is possible, for instance due to misalignment of the photoresist mask. If any of the tungsten plugs is exposed to this cleaning solution, the tungsten material might erode away.

Methods have been developed in the prior art wherein the erosion of the tungsten plugs is avoided.

U.S. Pat. No. 6,153,531 discloses a method for making interconnects of the above mentioned kind, wherein erosion of the tungsten plugs is avoided by submersing the whole wafer in a dilute nitric acid solution before immersing it in the cleaning solvent. Said immersion in a dilute nitric acid takes place until a tungsten oxide passivating film is formed above the tungsten that is not covered by the metallisation layer. This film is insoluble in the cleaning solvent.

Nitric acid is however a highly corrosive, environment-unfriendly material. Another disadvantage of this method is that, apart from the expenses on renewal of the acid, a high consumption of de-ionised water is required for rinsing the wafer after this acid treatment. The passivation also requires a very precise control of the pH of the acid, which is an expensive process to support in production.

Another method for making interconnects while avoiding the erosion of the tungsten plugs is disclosed in U.S. Pat. No. 6,077,762. Before submerging the semiconductor substrate in a cleaning solvent to remove the post plasma etching polymer residues, the electric charge of the metallisation layer built-up during the plasma etching is neutralised by contacting this layer with a conductive liquid, particularly a liquid metal such as mercury, that is electrically grounded. However, the use of a liquid conductive metal is rather non conventional, complicated and expensive.

U.S. Pat. No. 6,093,658 discloses still another method for making interconnects wherein, before submersion into the cleaning solvent, the obtained wafer is exposed to an electron dose of 5.000 $\mu C/cm^2$ to 25.000 $\mu C/cm^2$ that is configured to neutralise the electric charge built-up in the metallisation layer. This method however requires an electron beam system which is no typical system used in the manufacturing of semiconductor IC's and is relatively expensive.

BRIEF SUMMARY OF THE INVENTION

The invention seeks to provide a simple and economic method for making interconnect structures with tungsten plugs which do not erode.

In accordance with the invention, this object is accomplished by submitting, before submerging into the cleaning solvent, the wafer to a plasma containing F, H or a mixture of both.

Plasma equipment are conventional tools in the manufacturing of Integrated Circuits and each manufacturer of IC's has one or more of these tools. Plasma treatment is well known in the technical field using field proven equipment and is simple, economic and environment-friendly and more flexible for automatisation approach compared to the above mentioned prior art solution.

In another variant, this plasma treatment is combined with said dry removal of the organic mask in a plasma containing F, H or a mixture of F and H.

This combined treatment permits to simplify further the manufacturing of the interconnect structure and the costs can be further reduced. Such combination would not be possible if other techniques than a plasma treatment are used to avoid erosion of the tungsten plugs.

When the plasma contains fluorine, the recommended source of Fluorine in the plasma is $CF_4$, $NF_3$, $SF_6$, $CHF_3$, or $C_2F_6$ gas.

When the plasma contains Hydrogen, the recommended source of Hydrogen in the plasma is Forming gas (a mixture of $H_2$ and $N_2$) or water vapour ($H_2O$).

Oxygen, Oxygen containing gas or some neutral gas, like Argon, Helium and Nitrogen may be added to the plasma.

BRIEF DESCRIPTION OF THE SEVERAL VIEWS OF THE DRAWINGS

Details and characteristics of the invention will appear from the following description in which reference is made to the attached drawings, wherein.

DETAILED DESCRIPTION OF THE INVENTION

Figure 1:
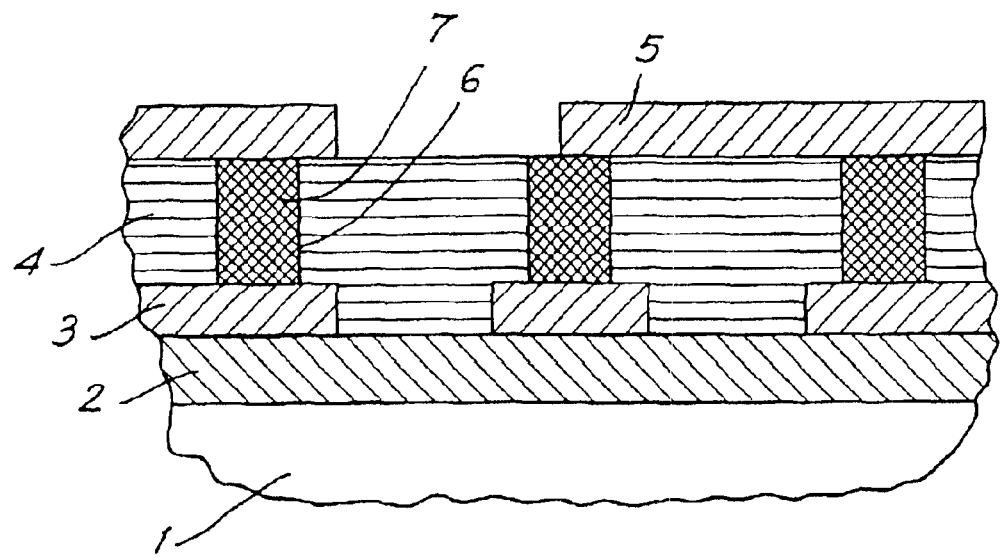
FIG. 1 schematically shows a first embodiment of interconnect structures according to the invention.

FIG. 1 shows a cross-sectional view of a first embodiment of interconnect structure for which the method of the invention is applicable. The interconnect structure shown in FIG. 1 consists of a first conductive layer 3, tungsten plugs 7 and a patterned metallisation layer 5. In the embodiment shown in FIG. 1 the first conductive layer consists of a first level of metal interconnect. All shown layers all form part of an integrated circuit, consisting of devices such as MOS and Bipolar transistors, as well as passive components, such as resistors and capacitors. Since these are not essential for describing the invention, these are not shown on FIG. 1, but are present in the silicon substrate which is denoted with 1 on FIG. 1. Contacts to IC devices are generally made using the first level of interconnects 3, but, in order not to overload the drawing, and since these are not necessary for explaining the invention in this particular embodiment of interconnect structure, these contacts to the IC devices are also not shown in FIG. 1.

As is well known, the first level of metal interconnects 3 of an integrated circuit is isolated from the underlying devices by a dielectric layer, denoted 2, in FIG. 1. The conductive metallisation layer 3 is deposited on top of the entire wafer, thus covering the dielectric layer 2. In the embodiment shown in FIG. 1, this metallisation layer is also patterned using conventional photolithography and plasma etching techniques.

An insulating layer 4 is next deposited on the entire wafer. This insulating layer 4 may be planarised using for instance conventional Chemical Mechanical Polishing technique.

A second interconnect layer, this is the patterned metallisation layer 5, is formed on the dielectric layer 4. In order to interconnect both interconnect layers 3 and 5, via holes 6 must be formed in the dielectric layer 4 and must subsequently be filled with a conductive material such as tungsten, such as to form tungsten plugs 7, before the metallisation layer 5 is deposited.

These via holes 6 are usually made using photolitography including the formation of a photoresist mask, and by using plasma etching for etching of the via holes 6 in the dielectric layer. After this etching the photoresist mask is removed.

In normal circumstances, the plugs 7 are completely covered by the patterned metallisation layer 5. However, due to misalignments of the photoresist mask and thus of the via holes 6 and/or of the patterned metallisation layer 5, portions of one or more tungsten plugs 7 may not be completely covered with the metallisation layer 5, as is depicted in FIG. 1. These may consequently be exposed during the removal of the post-etch residues in a cleaning solution.

Figure 2:
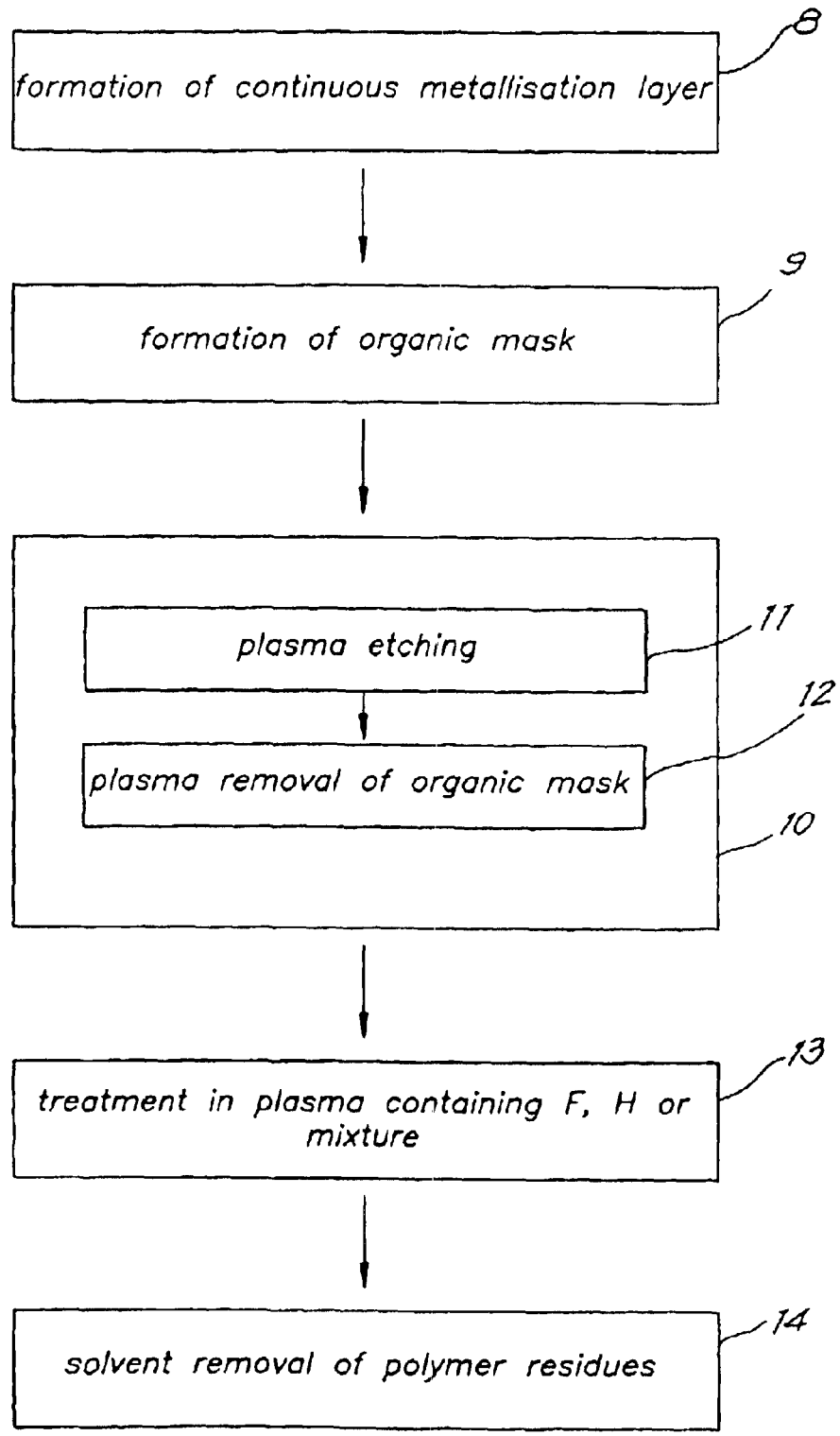
FIG. 2 is a block diagram of the last steps of the method or of a portion of the method for making interconnect structures according to the invention.

A schematic of the method for forming this patterned metallisation layer 5 is shown in the block diagram of FIG. 2.

In a first operation 8, a continuous metallisation layer, for instance from Al/Cu or Al/Si/Cu is deposited, for instance by sputtering, on the entire wafer, thereby covering the dielectric layer 4 and the tungsten plugs 7.

Next, this continuous metallisation layer is patterned by conventional photolithography and plasma etching techniques. In the operation 9 of photolithography, a photoresist organic mask is formed on top of the metallisation layer by first forming a photoresist layer on this metallisation layer, next selectively exposing the photoresist to a source of short-wavelength light through a patterned reticule and finally developing the photoresist.

Once the mask is formed, the obtained wafer is introduced in a plasma etcher wherein successively are performed a plasma etching operation 11 on the metal such that the exposed parts of the metallisation layer are etched away, and a stripping operation 12 wherein the resist mask is removed in situ. The fact that both operations 11 and 12 are performed in the same equipment is denoted by block 10 around blocks 11 and 12 in FIG. 2.

The resist stripping operation may be followed by an additional rinsing operation wherein the wafer is rinsed with de-ionised water. This rinsing step is not essential to the invention and is not shown in FIG. 2.

As described in the previous paragraph of this document, it may be the case that the metallisation or interconnect layer 5 leaves at least one of the tungsten plugs 7 not completely covered by this metal, for the above mentioned reason.

In order to then avoid erosion of these exposed portions of this or other tungsten plugs 7 during the subsequent removal of the residues in a cleaning solution, the wafer is transferred to an ex-situ plasma module wherein the wafer is subjected to operation 13, i.e. a treatment with a plasma containing F, H or a mixture of F and H.

As source of Fluorine in the plasma, gases as $CF_4$, $NF_3$, $SF_6$, $CHF_3$, or $C_2F_6$ are recommended.

As source of Hydrogen in the plasma, Forming-gas which is a mixture of $H_2$ and $N_2$, or water vapour ($H_2O$) is recommended.

Oxygen, Oxygen containing gas or some neutral gas, like Argon, Helium and Nitrogen may be added to the plasma.

After the supplemental plasma treatment, a cleaning operation 14 is accomplished which consists of immersing the obtained wafer in a solution to remove any post etch residues.

The formation of the patterned metallisation layer 5 according to the invention will be further illustrated by the following practical examples referring to FIGS. 1 and 2:

EXAMPLE 1

On top of the dielectric layer 4 and on the tungsten plugs 7 formed as described with reference to FIG. 1, a Al/Cu metallisation layer is sputtered (operation 8), and an i-line photoresist mask is formed using conventional photolithography (operation 9). This metallisation layer is plasma etched (operation 11) and the photoresist mask is plasma stripped in-situ using cluster P-5000 tool which includes a MxP etch chamber and a downstream strip chamber of Applied Materials (operation 12).

Then the wafer is treated in GaSonics L3300 plasma etch system (operation 13). The parameters of the plasma treatment 13 are as follows:

| Pressure: | 700 m Torr (0.0933 kPa) |
|---|---|
| RF Power: | 600 W |
| Forming-gas* flow rate: | 950 sccm (standard cm³) |
| N₂O flow rate: | 10 sccm |
| Platen temperature: | 250° C. |
| Process time: | 20 sec |

*Forming gas a is a mixture of Nitrogen with 4% of Hydrogen.

Once the plasma treatment is complete, the substrate is moved to a Semitool spray cleaning station for removal of residual polymers in EKC265 solvent (operation 14).

EXAMPLE 2

Example 1 is repeated but the plasma treatment (operation 13) is performed in a Lam 4520XL plasma etch system (operation 13) with the following parameters:

| Pressure: | 450 m Torr (0.0600 kPa) |
|---|---|
| RF Power top: | 200 W |
| RF Power bottom: | 200 W |
| $CF_4$ flow rate: | 10 sccm |
| $O_2$ flow rate: | 400 sccm |
| Electrode temperature: | 40° C./20 ° C. (Top/Bottom) |
| He pressure: | 15 Torr (2.000 kPa) |
| Process time: | 20 sec |

Figure 3:
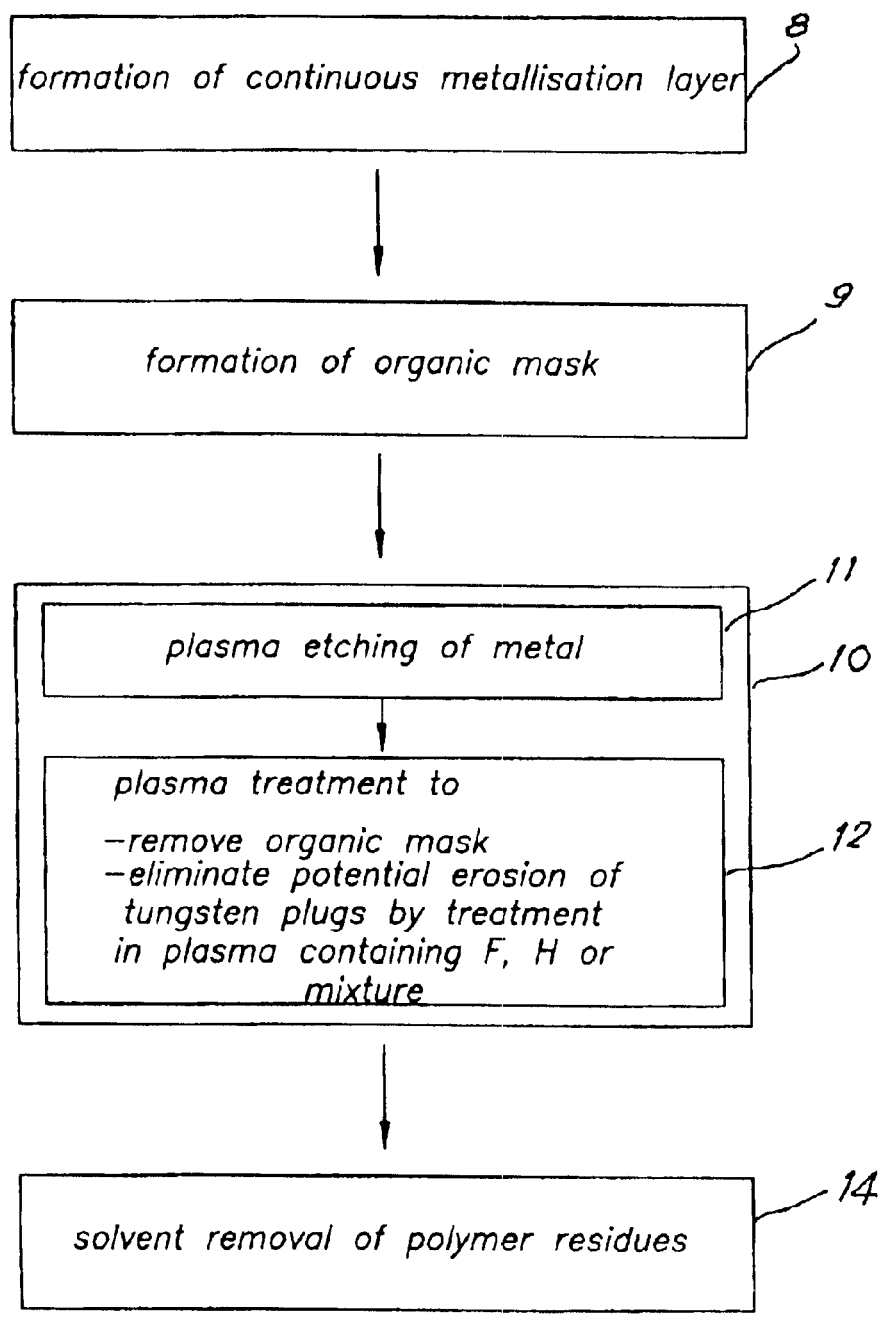
FIG. 3 is a block diagram similar to the one of FIG. 2, but pertaining to another variant of the invention.

In another variant of the invention, the patterned metallisation layer 5 is obtained as shown in the diagram of FIG. 3.

This variant of the method differs from the previous one that was shown in FIG. 2, in that the treatment with plasma containing F, H or a mixture of F and H (operation 13) is not performed ex-situ, but in-situ, this is in the same equipment used for the plasma etching of the metal and the plasma removal of the resist.

Consequently, the removal of the mask and the plasma treatment 13 are combined to a single plasma treatment operation 12. To indicate that operations 11 and 12 are taking place in the same equipment, a box 10 around the boxes for denoting respective operations 11 and 12, is shown in FIG. 3.

The following practical example will illustrate this embodiment with reference to FIGS. 1 and 3:

EXAMPLE 3

On the dielectric layer 4 and tungsten plugs 7 formed as described with reference to FIG. 1, an Al/Cu metallisation layer is sputtered (operation 8), and an i-line photoresist mask is formed using conventional photolithography (operation 9). This metallisation layer is plasma etched (operation 11) using a MxP etch chamber mounted on a P-5000 cluster tool of Applied Materials.

The photoresist mask is then stripped in a plasma using a downstream strip chamber mounted on the same P-5000 cluster unit. This stripping process is performed in three phases each with different parameters.

The first phase is used for removing the Chlorine-containing residues of the mask to prevent further corrosion of the to Al/Cu layer 5. The second phase is the main resist strip step, comparable to the one described in the first example. The third phase, which is relatively short compared to said previous phases, has the function of the plasma treatment 13 of the embodiment of FIG. 2, this is mainly to remove or reduce the electric charge built up during the second phase.

The parameters of this stripping are:

| | Phase 1 | Phase 2 | Phase 3 |
|---|---|---|---|
| Pressure In Torr (kPa): | 2(0,267) | 2(0,267) | 2(0,267) |
| RF Power in W: | 1000 | 1000 | 1000 |
| $O_2$ flow rate in sccm: | 0 | 3000 | 0 |
| $N_2$ flow rate in sccm: | 0 | 200 | 0 |
| $H_2O$ flow rate in sccm: | 500 | 0 | 500 |
| Platen temperature ° C.: | 250 | 250 | 250 |
| Process time in sec.: | 60 | 90 | 10 |

Once the plasma treatment is complete, the substrate is moved to a Semitool spray cleaning station for removal of residual polymers in EKC265 solvent (operation 14).

It is obvious that the conductive layer 3 must not necessarily be the first level of interconnect metal routing. The invention may also be applied for further metal levels, or to previous conductive layers such as source-drain regions of MOS transistors, emitter or base regions of bipolar transistors, poly or amorphous silicon interconnects, silicided regions, W—interconnects etc.

The method is thus applicable to any interconnect structure wherein tungsten plugs, connected to a conductive layer and formed in via holes in an insulating layer, are covered with a patterned metallisation layer. The method is thus suited to prevent erosion of exposed portions of the tungsten plugs, in all these interconnect structures.

Figure 4:
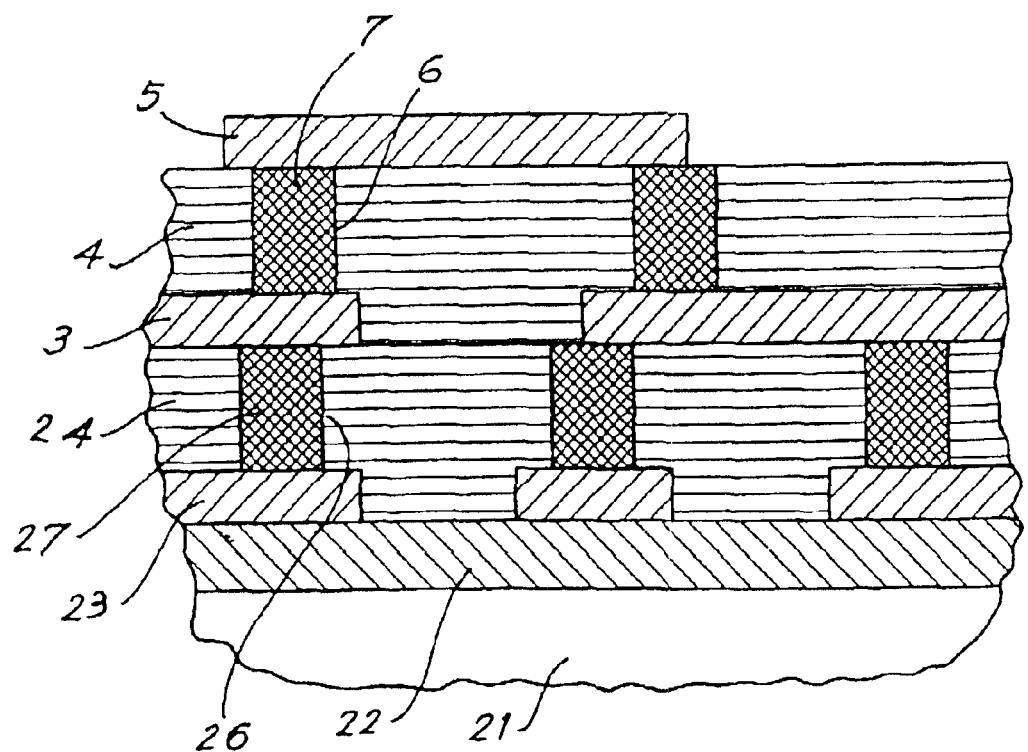
FIG. 4 shows a section similar to the one of FIG. 1, but pertaining to another embodiment of interconnect structure.

FIG. 4 shows another embodiment of an interconnect structure wherein the method of the invention is applicable. FIG. 4 shows a section of an integrated circuit having three levels of interconnect metal routing, layers 23, 3 and 5, one on top of the other. Two sets of tungsten plugs, 27 and 7, and two sets of intermetal insulating layers, 24 and 4, are present.

Either one of the layers or both layers 3 and 5, may be produced according to the method as described here-above with reference to FIGS. 2 and 3.

What is claimed is:

1. Method for making interconnect structures, particularly in a semiconductor integrated circuit, which comprises:

forming a conductive layer;

forming of an insulating layer above said conductive layer;

creating a plurality of holes in said insulating layer and filling the holes with tungsten thereby forming tungsten plugs, such that said tungsten plugs are in electrical contact with the conductive layer, forming a patterned metallisation layer that overlies said insulation layer and said tungsten plugs by;

forming a continuous metallisation layer, forming an organic mask, etching in plasma said continuous metallisation layer, removing the organic mask in a dry etch, and immersing the obtained wafer including the layers and the tungsten plugs in a cleaning solution to remove the post etching residues, wherein the method furthermore comprises, before immersing into said cleaning solution, submitting the wafer to a plasma treatment containing F, H or a mixture of F and H, with the purpose of avoiding tungsten erosion by removing or reducing the electric charge built up during removal of the organic mask.

2. Method according to claim 1, wherein said plasma treatment with F, H or a mixture of F and H is combined with said dry removal of the organic mask.

3. Method according to claim 1, wherein the plasma of said plasma treatment contains Fluorine and the recommended source of Fluorine in the plasma is $CF_4$, $NF_3$, $SF_6$, $CHF_3$, or $C_2F_6$ gas.

4. Method according to claim 1, wherein the plasma of said plasma treatment contains Hydrogen and the recommended source of Hydrogen in the plasma is Forming-gas (a mixture of $H_2$ and $N_2$) or water vapour ($H_2O$).

5. Method according to claim 1, wherein Oxygen, Oxygen containing gas or some neutral gas, like Argon, Helium and Nitrogen is added to the plasma.

* * * * *